(12) United States Patent
Choi et al.

(10) Patent No.: US 8,298,877 B2
(45) Date of Patent: Oct. 30, 2012

(54) ARRAY SUBSTRATE AND METHOD FOR MANUFACTURING THE ARRAY SUBSTRATE

(75) Inventors: Shin-Il Choi, Seoul (KR); Sang-Gab Kim, Seoul (KR); Yu-Gwang Jeong, Yongin-si (KR); Hong-Kee Chin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 319 days.

(21) Appl. No.: 12/777,347

(22) Filed: May 11, 2010

(65) Prior Publication Data
US 2010/0308334 A1 Dec. 9, 2010

(30) Foreign Application Priority Data
Jun. 9, 2009 (KR) .............................. 2009-0050842

(51) Int. Cl.
*H01L 21/44* (2006.01)
*H01L 21/84* (2006.01)
(52) U.S. Cl. .................. 438/149; 257/59; 257/E21.414; 257/E33.053; 438/158
(58) Field of Classification Search ........................ None
See application file for complete search history.

(56) References Cited

U.S. PATENT DOCUMENTS

| 6,319,861 | B1 * | 11/2001 | Shih et al. | 438/798 |
| 2007/0028445 | A1 * | 2/2007 | Su et al. | 29/840 |
| 2009/0294781 | A1 * | 12/2009 | Kim et al. | 257/88 |

FOREIGN PATENT DOCUMENTS

| KR | 1020020017439 A | 3/2002 |
| KR | 1020080020100 A | 3/2008 |
| KR | 1020080048936 A | 6/2008 |

* cited by examiner

*Primary Examiner* — Michelle Mandala
*Assistant Examiner* — Shaka White
(74) *Attorney, Agent, or Firm* — Cantor Colburn LLP

(57) ABSTRACT

An array substrate including: a gate electrode and a gate insulation layer disposed on a base substrate, the gate insulation layer having a first thickness in a first region and a second thickness in a second region, the first thickness being greater than the second thickness; a semiconductor pattern disposed on the gate insulation layer in the first region, an end portion of the semiconductor pattern having a stepped portion with respect to the gate insulation layer; an ohmic contact pattern disposed on the semiconductor pattern, an end portion of the ohmic contact pattern opposite to a channel portion being aligned with the end portion of the semiconductor pattern; and source and drain electrodes disposed on the ohmic contact pattern, the source and drain electrodes spaced apart from each other and including first and second thin-film transistor patterns.

16 Claims, 9 Drawing Sheets

153  162  124 142 144 151 152    122 130 110
            \_140_/ \_150_/

153  157  124 142 144 158    170 122 130 110
            \__140__/

US 8,298,877 B2

ARRAY SUBSTRATE AND METHOD FOR MANUFACTURING THE ARRAY SUBSTRATE

This application claims priority to Korean Patent Application No. 2009-0050842, filed on Jun. 9, 2009, and all the benefits accruing therefrom under 35 U.S.C. §119, the content of which in its entirety is herein incorporated by reference.

BACKGROUND OF THE INVENTION

1. Field of the Invention

Exemplary embodiments relate to an array substrate and a method for manufacturing the array substrate. More particularly, exemplary embodiments relate to an array substrate for a liquid crystal display ("LCD") device and a method for manufacturing the array substrate.

2. Description of the Related Art

Generally, a LCD device includes an array substrate on which switching elements are formed to operate each pixel area, an opposite substrate facing the array substrate and a liquid crystal layer disposed between the array substrate and the opposite substrate. The LCD panel applies a voltage to the liquid crystal layer and controls the transmissivity of light from a backlight assembly, which is typically disposed under the opposite substrate, to display an image.

The array substrate includes a thin-film transistor ("TFT"), which functions as the switching element, and is manufactured using patterns formed in a plurality of photolithographic processes. Generally, a specific mask is used in each photolithographic process, thus numerous masks may be used. However, a four-mask process using four masks has been recently used for manufacturing the array substrate. Because the process uses only four masks, the process is simpler and has lower costs than processes that use a larger number of masks. In the four-mask process, first a metal layer for a data line is etched in a first etching process to form a data line, then the metal layer for the data line and a channel layer formed under the metal layer for the data line are etched in a second etching process to form a source electrode, a drain electrode and a channel portion. The first etching process is a wet etching process and the second etching process includes wet and dry etching processes.

In order to manufacture a large, high resolution LCD device, copper, which has low resistivity, is used for the metal layer for a gate line and/or the metal layer for the data line. In addition, titanium and copper are used at the same time to decrease the resistance of the line.

However, pure titanium easily oxidizes to form a surface oxide layer that is substantially inert to etching gases. Thus a metal layer including titanium is not reactive with and thus not readily etched by an etching gas. Accordingly, the dry etching process may be difficult to perform on a metal layer including titanium.

BRIEF SUMMARY OF THE INVENTION

Exemplary embodiments provide an array substrate capable of improving the reliability of a manufacturing process in a dry etching process.

Exemplary embodiments provide a method for manufacturing the array substrate.

In an array substrate according to an embodiment, an array substrate includes a gate electrode disposed on a base substrate; a gate insulation layer disposed on the base substrate on which the gate electrode is disposed, the gate insulation layer having a first thickness in a first region and a second thickness in a second region; the first thickness is being greater than the second thickness; a semiconductor pattern disposed on the gate insulation layer in the first region; an end portion of the semiconductor pattern having a stepped portion with respect to the gate insulation layer; an ohmic contact pattern disposed on the semiconductor pattern, an end portion of the ohmic contact pattern opposite to a channel portion being aligned with the end portion of the semiconductor pattern; and source and drain electrodes disposed on the ohmic contact pattern, the source and drain electrodes spaced apart from each other and including first and second thin film transistor ("TFT") patterns, wherein an end portions of the first and second thin film transistor patterns have a stepped portion with respect to each other.

The array substrate may include a gate line disposed on the base substrate; a data line disposed on the base substrate on which the gate line is disposed, wherein a first line pattern and a data line pattern form a stepped portion with respect to each other and the first line pattern and the data line pattern cross the gate line; and a pixel electrode electrically contacts the drain electrode.

An end portion of the second TFT pattern may be aligned with an end portion of the ohmic contact pattern, and the end portion of the second TFT pattern and an end portion of the first TFT pattern may have a stepped portion with respect to each other.

A first distance between portions of the second TFT pattern corresponding to the source and drain electrodes may be greater than a second distance between portions of the first TFT pattern corresponding to the source and drain electrodes.

A method for manufacturing an array substrate according to an embodiment includes, sequentially disposing first and second metal layers on a base substrate, on which a gate line, a gate electrode and a channel layer are disposed; sequentially etching the second and first metal layers to form a metal line pattern, the metal line pattern including first and second line patterns and a first electrode pattern, the first electrode pattern including first and second element patterns; partially etching the second element pattern to form a second electrode pattern, the second electrode pattern including the first element pattern and a partially etched second element pattern; partially etching the second line pattern to form a data line, the data line including the first line pattern and a partially etched second line pattern; converting an oxide layer to a fluoride layer by contacting the oxide layer with a reactive gas, the reactive gas including a fluoride containing compound, the oxide layer being naturally formed on the first element pattern when forming the second electrode pattern; etching the fluoride layer and an exposed portion of the first element pattern to form a source electrode electrically connected to the data line and a drain electrode spaced apart from the source electrode; and disposing a pixel electrode, the pixel electrode electrically contacting the drain electrode.

The first metal layer may include titanium, and the second metal layer may include copper.

The width of the first element pattern may be greater than a width of the partially etched second element pattern. A distance between the source and drain electrodes of the etched first element pattern may be about 2 micrometers to about 3 micrometers.

The reactive gas may include at least one gas selected from a group consisting of carbon tetrafluoride, sulfur hexafluoride, a mixture of sulfur hexafluoride and helium, a mixture of sulfur hexafluoride and nitrogen, a mixture of sulfur hexafluoride and oxygen and a mixture of sulfur hexafluoride, oxygen and helium.

The first and second electrode patterns and the data line may be formed via wet etching, and the source and drain electrodes may be formed via dry etching.

An embodiment of a method for manufacturing an array substrate may include disposing a gate insulation layer on the base substrate on which the gate line and the gate electrode are formed are disposed, and disposing a photoresist layer on the second metal layer.

Forming the first electrode pattern may further include forming an exposed area through the photoresist layer using a mask to form a source photo pattern; and etching the first and second element patterns in a region exposed by the source photo pattern to form the first electrode pattern having a width, which is less than a width of the source photo pattern.

A method for manufacturing an array substrate according to an embodiment includes, etching the channel layer to form a sub-channel pattern having a width, which is substantially the same as a width of the source photo pattern; and removing the source photo pattern to form a remaining photo pattern, wherein an end portion of the remaining photo pattern being is aligned with an end portion of the first electrode pattern, and the remaining photo pattern has a separate portion corresponding to a separation region between the source and drain electrodes.

Forming the source and drain electrodes may further include etching the first element pattern using the remaining photo pattern as a mask to form the source and drain electrodes, wherein a separation distance between portions of the first element pattern after the etching is less than a separation distance between portions of the second element pattern after the etching, etching the sub-channel pattern using the remaining photo pattern as a mask to form a channel pattern including a channel portion, and etching the gate insulation layer in a region exposed by the remaining photo pattern and the sub-channel pattern to form an etched gate insulation layer.

Etched portions of the etched gate insulation layer may have a stepped portion with respect to each other.

The source and drain electrodes and the channel pattern may be formed at the same time, an etching gas may include chlorine and fluorine, and an etching component may include chloride ions.

A reaction rate of the sub-channel pattern and an etching gas and a reaction rate of the gate insulation layer and the etching gas may be greater than a reaction rate of the first element pattern and the etching gas.

An etching gas may include metal and channel etching gases, the metal etching gas etching the first element pattern and includes chlorine, the channel etching gas etching the sub-channel pattern and including chlorine and fluorine, an etching component of the etching gas may include chloride ions.

The chloride ions of the metal etching gas may etch the sub-channel pattern, and a reaction rate of the sub-channel pattern and the metal etching gas may be greater than a reaction rate of the first element pattern and the metal etching gas.

A reaction rate of the gate insulation layer and the etching gas may be greater than a reaction rate of the first element pattern and the etching gas.

According to some exemplary embodiments, a dry etching process is conducted normally since an oxide layer of the first element pattern may be converted to a fluoride layer, which may be easily vaporized. Accordingly, the reliability of the manufacturing process may be improved.

BRIEF DESCRIPTION OF THE DRAWINGS

The above and other features, aspects and advantages of this disclosure will become more apparent by describing in further detail exemplary embodiments thereof with reference to the accompanying drawings, in which.

DETAILED DESCRIPTION OF THE INVENTION

Figure 1:
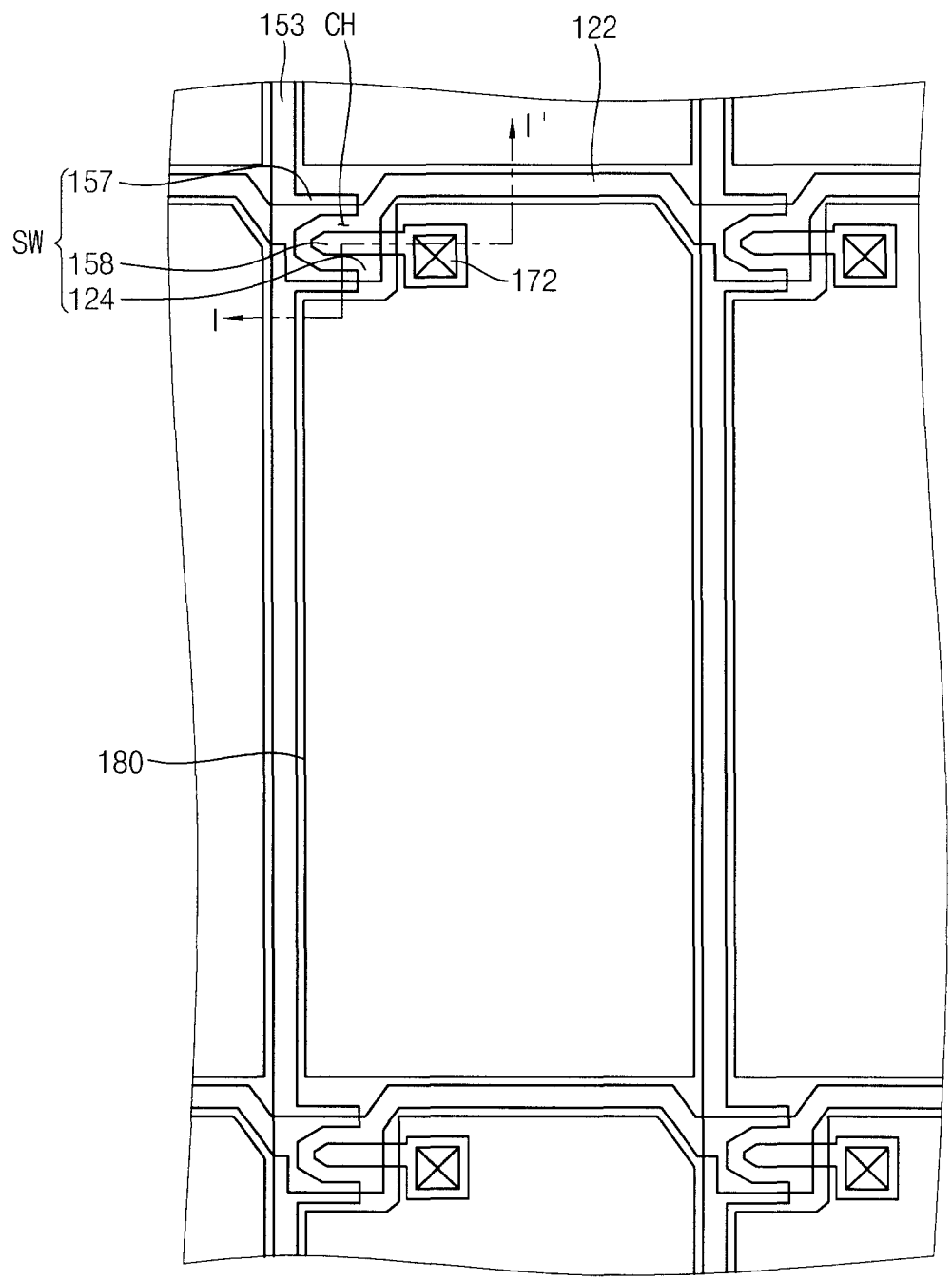
FIG. 1 is a top plan view illustrating an exemplary embodiment of an array substrate.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. Rather, these embodiments are provided so that this disclosure will be thorough and complete, and will fully convey the scope of the present invention to those skilled in the art. Like reference numerals refer to like elements throughout. In the drawings, the sizes and relative sizes of layers and regions may be exaggerated for clarity.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-sectional illustrations that are schematic illustrations of idealized exemplary embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in further detail with reference to the accompanying drawings.

Figure 2:
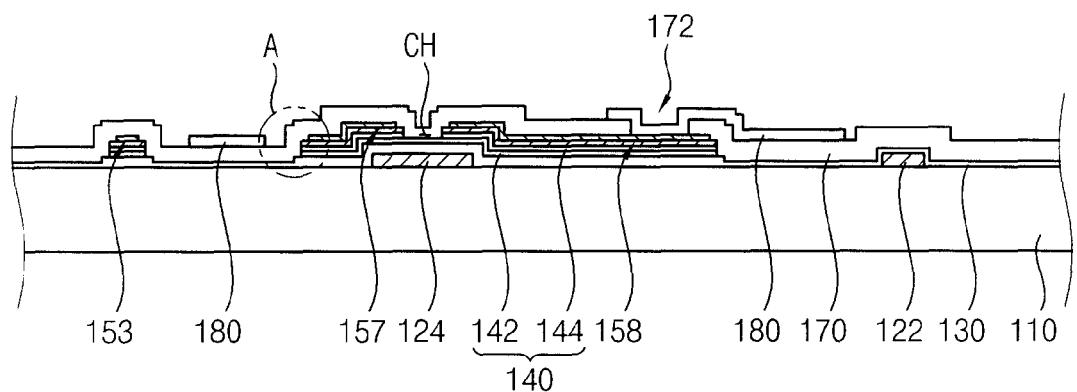
FIG. 2 is a cross-sectional view taken along line I-I' of FIG. 1.

FIG. 1 is a top plan view illustrating an exemplary embodiment of an array substrate. FIG. 2 is a cross-sectional view taken along line I-I' of FIG. 1.

Referring to FIGS. 1 and 2, an array substrate 100 includes a gate line 122, a data line 153, a switching element SW and a pixel electrode 180.

For example, in one exemplary embodiment the gate line 122 extends in a first direction D1 of the base substrate 110, and a plurality of the gate lines 122 is arranged substantially in parallel in a second direction D2, which is different from the first direction D1. In one exemplary embodiment, the first direction D1 and the second direction D2 may be substantially perpendicular to each other.

The data line 153 extends in the second direction D2 and a plurality of the data lines 153 is arranged substantially in parallel in the first direction. The data line 153 intersects the gate line 122, e.g. the data line 153 crosses over the gate line 122 and the data line 153 and the gate line 122 are vertically aligned at the intersection therebetween.

The switching element SW includes a gate electrode 124, a source electrode 157 and a drain electrode 158. The gate electrode 124 is electrically connected to the gate line 122. The source electrode 157 is electrically connected to the data line 153. The drain electrode 158 is spaced apart from the source electrode 157. An end portion of the drain electrode 158 makes contact with the pixel electrode 180 through a contact hole 172 so that the switching element SW is electrically connected to the pixel electrode 180.

The array substrate 100 further includes a gate insulation layer 130, a channel pattern 140 and a passivation layer 170.

The gate insulation layer 130 is disposed on a base substrate 110 and on the gate line 122 and the gate electrode 124, which are also disposed on the base substrate 110.

The channel pattern 140 is disposed on the gate insulation layer 130, which is disposed on the gate electrode 124, and overlaps with the gate electrode 124. The channel pattern 140 is disposed between the gate insulation layer 130 and a metal layer for forming the data line 153. In one exemplary embodiment, the metal layer for the data line is patterned to provide the source electrode 157, the drain electrode 158 and the data line 153. A channel portion CH is disposed between the source and drain electrodes 157 and 158.

The data line 153 and the source and drain electrodes 157 and 158, respectively, are formed via patterning the metal layer for forming the data line 153.

The passivation layer 170 is disposed on a base substrate 110, on which the data line 153 and the source and drain electrode 157 and 158 are disposed, and includes the contact hole 172 partially exposing the drain electrode 158.

Figure 3:
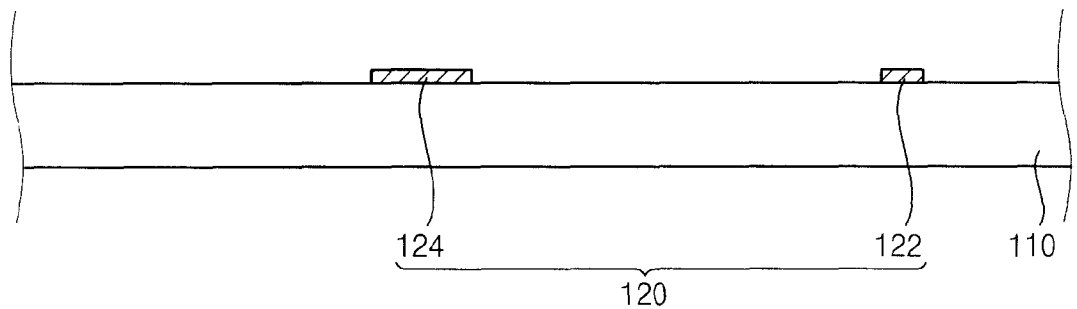
FIG. 3 is a cross-sectional view illustrating an exemplary embodiment of a method of manufacturing a gate pattern of the array substrate of FIG. 2.

FIG. 3 is a cross-sectional view illustrating an exemplary embodiment of a method of manufacturing the gate pattern of the array substrate of FIG. 2. FIGS. 4 to 10 are cross-sectional views illustrating an exemplary embodiment of a method of manufacturing the source pattern and the channel portion of the array substrate of FIG. 2. FIG. 11 is a cross-sectional view illustrating an exemplary embodiment of a method of manufacturing the passivation layer of the array substrate of FIG. 2. Hereinafter, an embodiment of a method for manufacturing the array substrate will be explained in further detail.

Referring to FIG. 3, a gate pattern 120 is disposed on the base substrate 110. The gate pattern 120 includes the gate line 122 and the gate electrode 124.

For example, in one exemplary embodiment a gate metal layer (not shown) may be disposed on the base substrate 110, a gate photo pattern (not shown) may be disposed on the gate metal layer using a first mask (not shown), and the gate metal layer may be etched using the gate photo pattern as an etch stop layer, to form the gate pattern 120. In an exemplary embodiment the gate metal layer may be wet etched.

The base substrate 110 may be a transparent-insulating substrate, such as a glass substrate or other material having similar characteristics. The gate metal layer may include a metal, such as aluminum (Al), molybdenum (Mo), neodymium (Nd), chromium (Cr), tantalum (Ta), titanium (Ti), tungsten (W), copper (Cu), silver (Ag), an alloy thereof, or the like or a combination thereof. In an exemplary embodiment, the gate metal layer may consist essentially of a metal such as aluminum, molybdenum, neodymium, chromium, tantalum, titanium, tungsten, copper, silver, an alloy thereof, or the like or a combination thereof. In another exemplary embodiment, the gate metal layer may consist of a metal such as aluminum, molybdenum, neodymium, chromium, tantalum, titanium, tungsten, copper, silver, an alloy thereof or a combination thereof. Alternative exemplary embodiments include configurations wherein the gate metal layer may have a multi-layer structure including greater than or equal to two metal layers wherein at least two of the metal layers have different physical characteristics.

Figure 4:
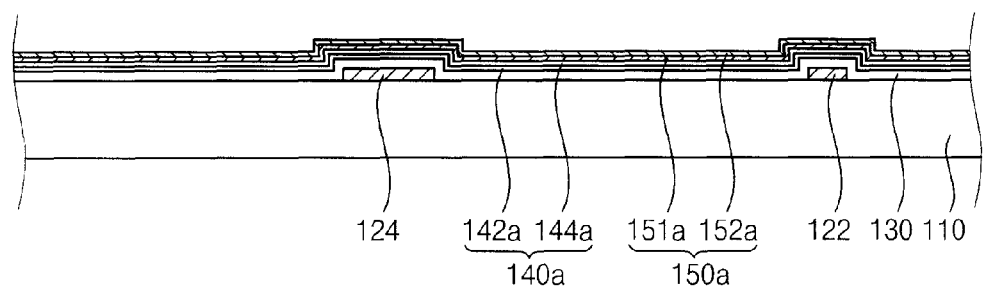
FIGS. 4 to 10 are cross-sectional views illustrating an exemplary embodiment of a method of manufacturing a source pattern and a channel portion of the array substrate of FIG. 2.

Referring to FIGS. 2, 3 and 4, the gate insulation layer 130, a channel layer 140a and the metal layer for the data line 150a are sequentially disposed on the base substrate 110 on which the gate pattern 120 is disposed. For example, in one exemplary embodiment the gate insulation layer 130 and the channel layer 140a may be formed via a plasma-enhanced chemical vapor deposition ("PECVD") process.

In an embodiment, the gate insulation layer 130 may include silicon nitride (e.g., $SiN_x$, $0<x<1$) and silicon oxide (e.g., $SiO_y$, $0<y<1$). In another embodiment the gate insulation layer 130 may comprise silicon nitride (e.g., $SiN_x$, wherein x is greater than 0 and less than or equal to about 1.3), silicon oxide (e.g., $SiO_y$, wherein y is greater than 0 and less than or equal to about 2), or the like or a combination thereof. The channel layer 140a includes a semiconductor layer 142a and an ohmic contact layer 144a. The semiconductor layer 142a may be disposed on the gate insulation layer 130 and may include amorphous silicon ("a-Si") or the like. The ohmic contact layer 144a is disposed on the semiconductor layer 142a and may include an n-doped amorphous silicon ("n+ a-Si"), or the like, and thus may include amorphous silicon, which has been doped with n-type impurities at a high density.

Then, the metal layer for the data line 150a is disposed on the channel layer 140a. The metal layer for the data line 150a includes a first metal layer 151a and a second metal layer 152a, which may be disposed sequentially. In one exemplary embodiment, the metal layer for the data line 150a may be disposed via a sputtering process. In one exemplary embodiment, the first metal layer 151a may include titanium (Ti) and the second metal layer may include copper (Cu). In an exemplary embodiment, the first metal layer 151a may consist essentially of titanium or the like and the second metal layer may consist essentially of copper or the like. In another exemplary embodiment, the first metal layer 151a may consist of titanium and the second metal layer may consist of copper. In an exemplary embodiment the first metal layer 151a is disposed before the second metal layer 152a is disposed; for example, copper may be deposited after titanium is deposited.

Figure 5:
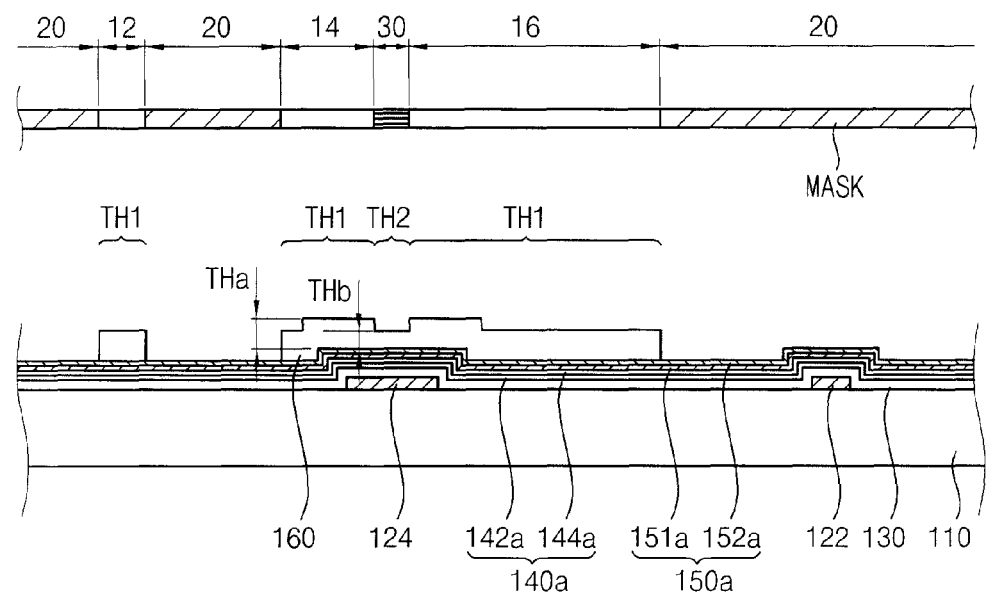

Referring FIGS. 2, 4 and 5, a photoresist pattern layer (not shown) is formed via coating photoresist materials on the metal layer for the data line 150a, and a source photo pattern 160 is formed via patterning the photoresist layer using a second mask.

For example, in one exemplary embodiment the photoresist layer may include a negative-type photoresist material. In an exemplary embodiment wherein a negative-type photoresist is used, a portion of the negative-type photoresist material on which light is irradiated is cured and remains, and a portion of the negative-type photoresist material on which light is not irradiated is removed. Alternative exemplary embodiments include configurations wherein the photoresist layer may include a positive-type photoresist material. In an exemplary embodiment wherein a positive-type photoresist is used, a portion of the positive-type photoresist material on which the light is not irradiated is cured and remains, and a portion of the positive-type photoresist material on which the light is irradiated is removed. According to type and/or other characteristics of the photoresist layer, the second mask MASK may be designed without further undue experimentation by one of skill in the art. The photoresist layer according to the present exemplary embodiment includes the negative photoresist material.

The second mask MASK may be a slit mask and include first, second and third light-transmitting portions 12, 14 and 16, respectively, a light-blocking portion 20 and a diffracting portion 30. The source photo pattern 160 includes a first thick portion TH1 and a second thick portion TH2.

The first, second and third light-transmitting portions 12, 14 and 16, respectively, include a first light-transmitting portion 12 corresponding to an area of the base substrate 110 on which the data line 153 of FIG. 1 may be disposed, a second light-transmitting portion 14 corresponding to an area of the base substrate 110 on which the source electrode 157 may be disposed and a third light-transmitting portion 16 corresponding to an area of the base substrate 110 on which the drain electrode 158 may be disposed. The first thickness portion TH1 is disposed on the portion of the metal layer for the data line 150a corresponding to the first, second and third light-transmitting portions 12, 14 and 16. The first thickness portion TH1 may have a first thickness THa. The first thickness THa may be substantially equal to or less than an initial thickness of the photoresist layer formed via coating the photoresist material. The diffraction portion 30 corresponds to an area on which the channel portion CH of FIG. 1 may be disposed. The second thick portion TH2 is disposed on the portion of the metal layer for the data line 150a corresponding to the diffraction portion 30. The second thick portion TH2 has a second thickness THb. The second thickness THb may be less than the first thickness THa.

Figure 6:
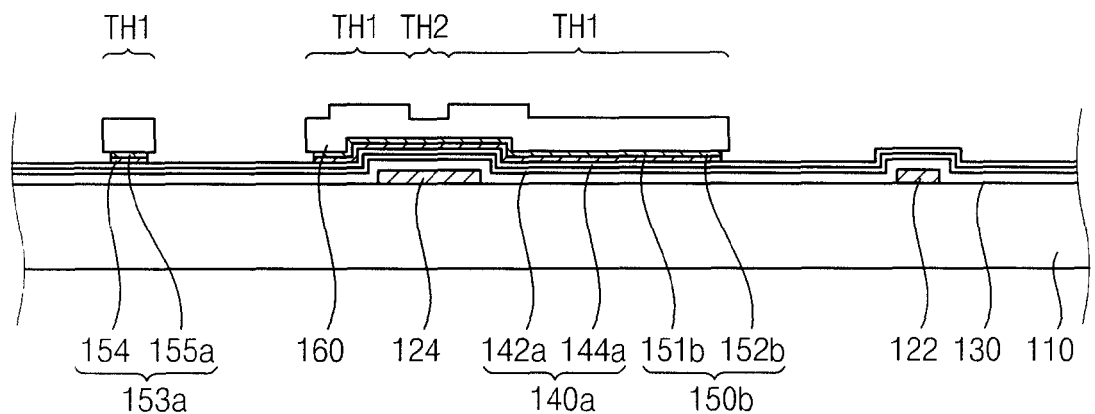

In one exemplary embodiment, the mask may be a half-tone mask and include a transflective portion. A half-tone (e.g., transflective) portion may be disposed at the diffraction portion 30 in the exemplary embodiment wherein the half-tone mask is used. Referring to FIGS. 2, 5 and 6, the first metal layer 151a and the second metal layer 152a are sequentially etched using the source photo pattern 160 as an etch stop layer.

For example, a first electrode pattern 150b connected to the metal line pattern 153a and the metal line pattern 153a itself are formed via etching the metal layer for the data line 150a.

The metal line pattern 153a includes a first line pattern 154 and a second line pattern 155a, and the first electrode pattern 150b includes a first element pattern 151b and a second element pattern 152b.

The metal layer for the data line 150a may be patterned, for example, in one exemplary embodiment, by wet etching. Thus, the width of the metal line pattern 153a and that of the first electrode pattern 150b may be narrower than that of the source photo pattern 160.

Figure 7:
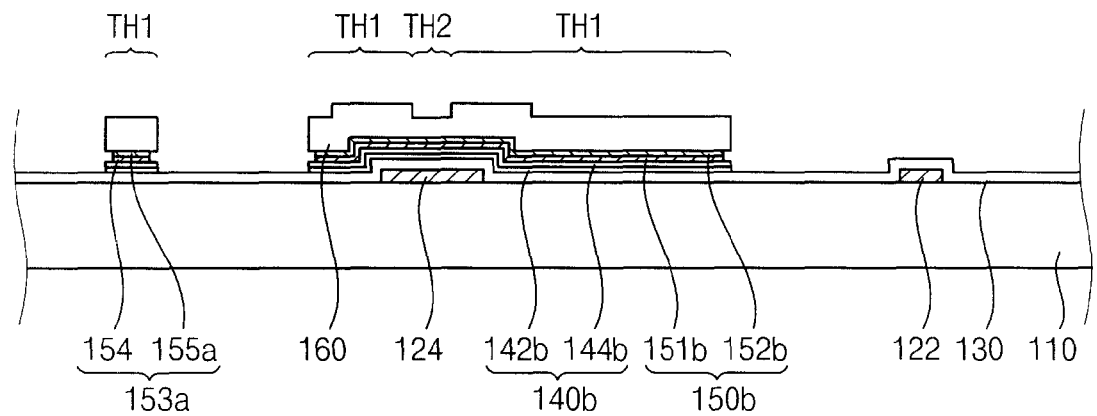

Referring to FIGS. 2, 6 and 7, a sub-channel pattern 140b, which includes a sub-semiconductor pattern 142b and a sub-ohmic pattern 144b, is formed via etching a portion of a channel layer 140a, which is not covered with the source photo pattern 160, using the source photo pattern 160. The sub-channel pattern 140b remains under the metal line pattern 153a and the first electrode pattern 150b. The gate insulation layer 130 is exposed on an area of the base substrate 110, which does not correspond to the source photo pattern 160. The channel layer 140a may be formed, for example, in one exemplary embodiment, by dry etching. Thus, the width of the sub-channel pattern 140b may be substantially the same as the width of the source photo pattern 160.

Figure 8:
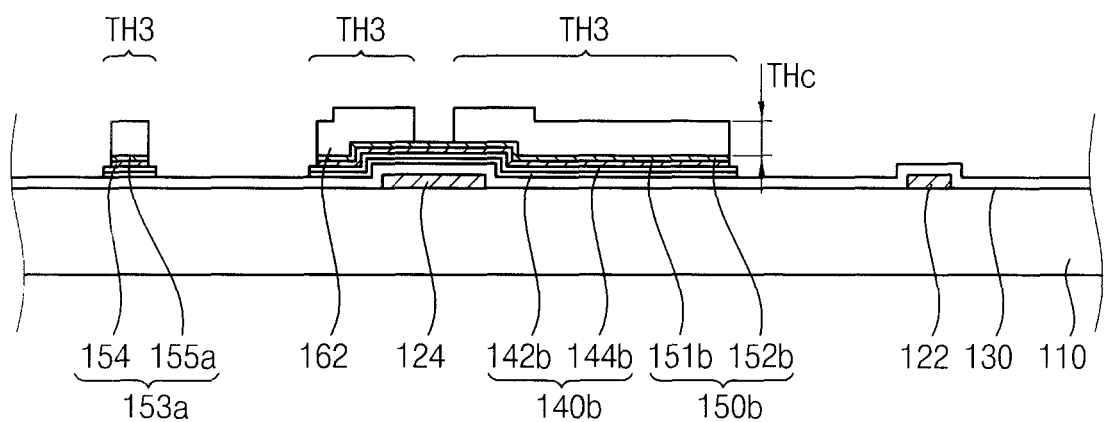

Referring to FIGS. 2, 7 and 8, a remaining photo pattern 162 is formed via removing the second thickness portion TH2 of the source photo pattern 160. An end portion of the remaining photo pattern 162 is substantially aligned with an end portion of the first electrode pattern 150b, and the remaining photo pattern 162 has a separate portion corresponding to a separation region between the source and drain electrodes 157 and 158.

The remaining photo pattern 162 includes a third thickness portion TH3. A portion of the first thickness portion TH1 is removed corresponding to the second thickness THb of the second thickness portion TH2 is removed to form the third thick portion TH3. A portion of the second element pattern 152b corresponding to the channel portion CH is exposed by the third thickness portion TH3 of the remaining photo pattern 162. The third thickness portion TH3 has a third thickness THc, which may be less than the first thickness THa of the first thickness portion TH1.

Figure 9:
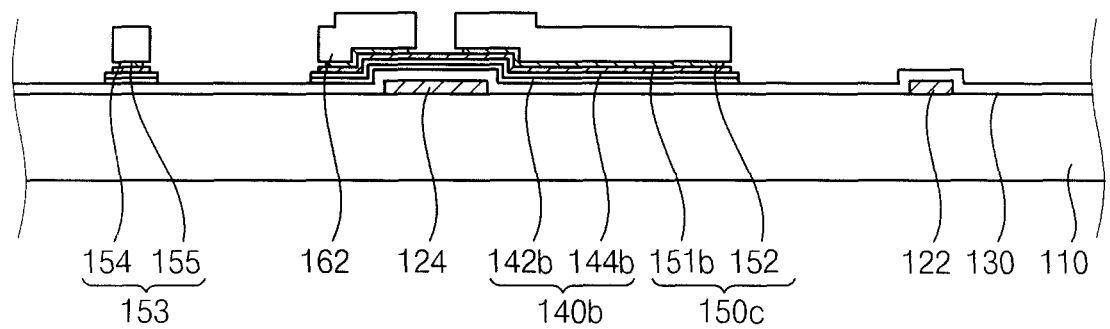

Referring to FIGS. 2, 8 and 9, the exposed second element pattern 152b is partially etched using the remaining photo pattern 162 as the etch stop layer to form a first thin-film transistor ("TFT") pattern 152. Accordingly, a second electrode pattern 150c, which includes the first TFT pattern 152 and the first element pattern 151b, is formed.

The second line pattern 155a is partially etched using the remaining photo pattern 162 as the etch stop layer to form a data line pattern 155. Accordingly, the data line 153, including the data line pattern 155 and the first line pattern 154, is formed.

In an exemplary embodiment, since the second element pattern 152b is wet etched, the width of the first TFT pattern 152, which is included in the second electrode pattern 150c, may be narrower than the width of the remaining photo pattern 162.

Then, an oxide layer of the first element pattern 151b may be converted to a fluoride layer using a reactive gas, which includes a fluoride containing compound. For example, as the second electrode pattern 150c is disposed, or after the second electrode pattern 150c is disposed, a surface of the first element pattern 151b may be oxidized. In an exemplary embodiment, the oxidized surface of the first element pattern 151b may be converted to the fluoride layer by contacting the oxide layer with the fluoride containing compound. The fluoride layer may have a significant vapor pressure, thus may be readily vaporized, thereby, facilitating removal of the fluoride layer.

For example, in one exemplary embodiment the reactive gas may include the fluoride containing compound in a highly activated state. In an exemplary embodiment, the reactive gas may break the combination of the first element pattern 151b and the oxide component, and replace the oxygen of the oxide layer with fluoride from the reactive gas, thereby forming the fluoride layer on the first element pattern 151b. In an exemplary embodiment, the fluoride layer may include, for example, titanium fluoride.

While not wanting to be bound by theory, it is understood that the boiling point of the fluoride layer, which may comprise titanium fluoride, may be between about 50° C. and about 100° C., specifically about 75° C., thus the titanium fluoride may be easily vaporized. In an exemplary embodiment, after vaporization the first element pattern 151b does not substantially include an oxide layer or a fluoride layer. Accordingly, the first element pattern 151b may be normally etched without interference from a layer such as an oxide layer.

The reactive gas may include, for example, carbon tetrafluoride ($CF_4$), sulfur hexafluoride ($SF_6$), a mixture of sulfur hexafluoride and helium ($SF_6$/He), a mixture of sulfur hexafluoride and nitrogen ($SF_6$/$N_2$), a mixture of sulfur hexafluoride and oxygen ($SF_6$/$O_2$), a mixture of sulfur hexafluoride, oxygen and helium ($SF_6$/$O_2$/He), or the like or a combination thereof. In an exemplary embodiment, the reactive gas may consist essentially of carbon tetrafluoride ($CF_4$), sulfur hexafluoride ($SF_6$), a mixture of sulfur hexafluoride and helium ($SF_6$/He), a mixture of sulfur hexafluoride and nitrogen ($SF_6$/$N_2$), a mixture of sulfur hexafluoride and oxygen ($SF_6$/$O_2$), a mixture of sulfur hexafluoride, oxygen and helium ($SF_6$/$O_2$/He), or the like or a combination thereof. In another embodiment, the reactive gas may consist of carbon tetrafluoride ($CF_4$), sulfur hexafluoride ($SF_6$), a mixture of sulfur hexafluoride and helium ($SF_6$/He), a mixture of sulfur hexafluoride and nitrogen ($SF_6$/$N_2$), a mixture of sulfur hexafluoride and oxygen ($SF_6$/$O_2$), a mixture of sulfur hexafluoride, oxygen and helium ($SF_6$/$O_2$/He) or a combination thereof.

For example, in an exemplary embodiment wherein the reactive gas is a mixture of sulfur hexafluoride and helium ($SF_6$/He), the internal pressure of a dry etching chamber providing the reactive gas may be about 60 millitorr (mT) to about 400 mT, specifically about 100 mT to about 300 mT, more specifically about 200 mT. In an exemplary embodiment, a mole ratio of sulfur hexafluoride to helium may be about 1:0 to about 1:5, specifically about 1:1 to about 1:4, more specifically about 1:2 to about 1:3.

Figure 10:
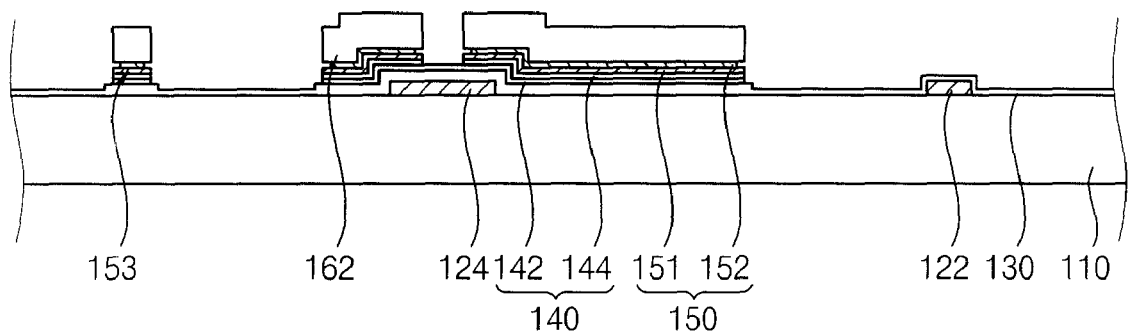
Figure 11:
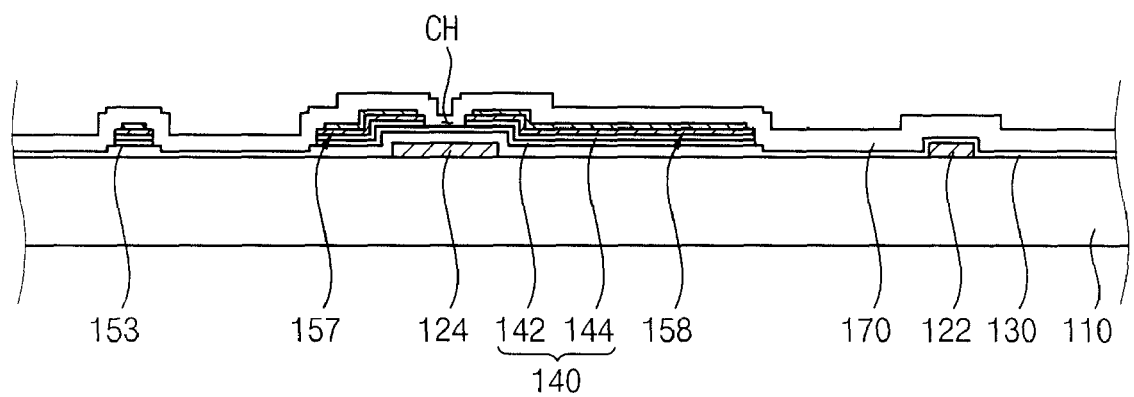
FIG. 11 is a cross-sectional view illustrating an exemplary embodiment of a method of manufacturing a passivation layer of the array substrate of FIG. 2.

Referring to FIGS. 2, 9 and 10, the remaining exposed portion of the first element pattern 151b is etched using the remaining photo pattern 162 as the etch stop layer. For example, in one exemplary embodiment the first element pattern 151b is dry etched to form the second TFT pattern 151 and the source and drain electrodes 157 and 158 of the switching element SW.

Accordingly, the source and drain electrodes 157 and 158 may include the first and second TFT patterns 152 and 151.

In an exemplary embodiment, the second TFT pattern 151 may have a width substantially the same as the remaining photo pattern 162.

The source electrode 157 is electrically connected to the data line 153, and the drain electrode 158 is spaced apart from the source electrode 157. A separation distance of the portions of the second TFT pattern 151 corresponding to the source and drain electrodes 157 and 158 of the switching element SW is decreased via dry etching. Accordingly, electrical characteristics of the switching element SW may be improved.

The portion of the first element pattern 151b exposed by the remaining photo pattern 162 may be dry etched using an etching gas. The etching gas may include a chlorine-based gas and may include chlorine. For example, in one exemplary embodiment an etching component of the etching gas may include chloride ions ($Cl^-$). In another embodiment, the etching gas may include a mixture of sulfur hexafluoride and chlorine (e.g., $SF_6$ and $Cl_2$).

In an embodiment, the exposed portion of the sub-channel pattern 140b, disposed and in an area, which is wider than the remaining photo pattern 162, and the portion of the sub-channel pattern 140b corresponding to the channel portion CH may be etched by the etching gas with the first element pattern 151b to form the channel pattern 140.

For example, in one exemplary embodiment the portion of the sub-ohmic pattern 144b exposed during the forming the source and drain electrodes 157 and 158 is partially removed, and the portion of the sub-ohmic pattern 144b exposed in the area wider than the remaining photo pattern 162 is also removed.

In such an exemplary embodiment, since a reaction rate of the sub-channel pattern 140b with the etching gas may be faster than the reaction rate of the first element pattern 151b with the etching gas, the thickness of the etched sub-channel pattern 140b may be greater than the thickness of the etched first element pattern 151b.

Additionally, since the gate insulation layer 130 is exposed on an area of the base substrate 110, which does not correspond to the area in which the sub-channel pattern 140b is disposed, the exposed portion of the gate insulation layer 130 may be etched by the etching gas along with the first element pattern 151b and the sub-channel pattern 140b.

In such an exemplary embodiment, the sub-channel pattern 140b is first etched in an area corresponding to the sub-channel pattern 140b, except for an area corresponding to the source and drain electrodes 157 and 158, and the gate insulation layer 130 is etched, so that the etched portions of the gate insulation layer 130 may have a stepped portion with respect to each other. Similarly, the reaction rate of the gate insulation layer 130 with the etching gas may be greater than the reaction rate of the first element pattern 151b with the etching gas. Accordingly, the thickness of the etched gate insulation layer 130 etched by the etching gas may be greater than the thickness of the etched first element pattern 151b etched by the etching gas.

Figure 13:
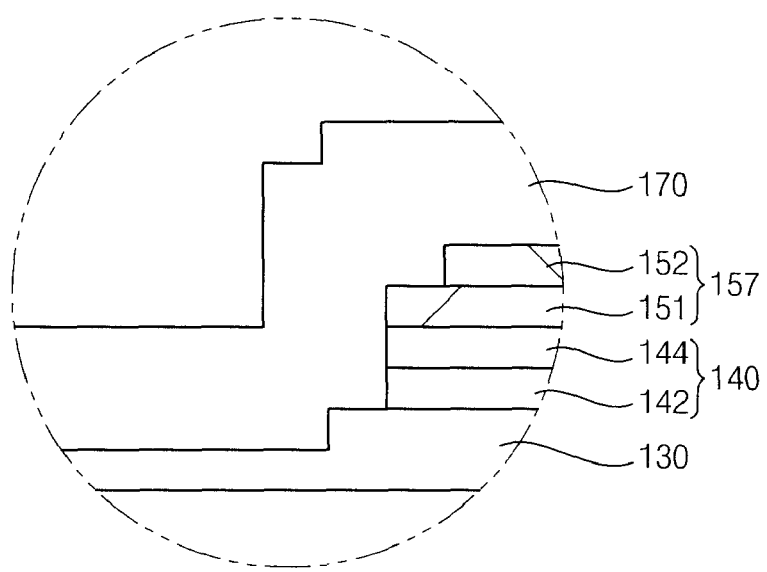
FIG. 13 is an enlarged cross-sectional view illustrating a portion 'A' of FIG. 2.

Accordingly, the semiconductor pattern 142, which is included in the channel pattern 140, is exposed to form the channel portion CH. The etched portions of the gate insulation layer 130 may be stepped with respect to each other as illustrated in FIG. 13, and the width of the channel pattern 140 may be reduced.

Additionally, the remaining photo pattern 162 is partially removed and the thickness of the remaining photo pattern may be less than the third thickness THc.

Referring to FIGS. 7 and 8 again, the channel layer 140a is etched to form the sub-channel pattern 140b and the source photo pattern 160 is etched to form the remaining photo pattern 162. According to the above-mentioned processes, the sub-ohmic pattern 144b may be entirely removed from the sub-semiconductor pattern 142b after etching the sub-ohmic pattern 144b.

In the present exemplary embodiment, the source photo pattern 160 is etched to form the remaining photo pattern 162 after the channel layer 140a is etched to form the sub-channel pattern 140b. Alternative exemplary embodiments include configurations wherein the channel layer 140a may be etched after etching the source photo pattern 160.

Referring to FIG. 10 again, the width of the semiconductor pattern 142 of the channel pattern 140 is less than the width of the sub-semiconductor pattern 142b of the sub-channel pattern 140b.

Accordingly, the ohmic contact pattern 144, which is included in the channel pattern 140, may be entirely removed, and the width of the semiconductor pattern 142 is reduced so that electrical characteristics of the switching element SW may be improved.

As illustrated in FIGS. 8 to 10, converting the oxide layer to the fluoride layer and forming the source and drain electrodes 157 and 158 may be performed in the dry etching chamber, which may be the same vacuum chamber.

Subsequently, a cleaning process may be performed. In the cleaning process, the base substrate 110, on which the channel portion CH is disposed, is taken out of the dry etching chamber, and chlorine ions, which are a component of the etching gas, are removed.

In the cleaning process, the chlorine ions may be removed from the base substrate 110 by dissolving the chloride ions in water. A dipping method including a step in which the base substrate 110 is put in and taken out of a cleaning container containing the water may be used as the cleaning process. Alternative exemplary embodiments include methods wherein the cleaning process may include a spraying method including a step in which the water is sprayed on the base substrate 110 at high pressure. In addition, the above-mentioned cleaning methods may be used in combination and at the same time. The impurities, including the chloride ions, may be partially removed from the base substrate 110 in the cleaning process.

The water may have a temperature between about 50° C. and about 80° C., specifically about 65° C. to increase a rate at which the chlorine ions are dissolved in the water.

Then, the remaining photo pattern 162 is removed from the base substrate 110. For example, in one exemplary embodiment the remaining photo pattern 162 may be removed by disposing the base substrate 110, including the remaining photo pattern 162, into a strip container containing a strip liquid and dissolving the remaining photo pattern 162 into the strip liquid. Alternative exemplary embodiments include configurations wherein the remaining photo pattern 162 may be removed from the base substrate 110 via an ashing process.

FIG. 11 is a cross-sectional view illustrating an exemplary embodiment of a method of manufacturing the passivation layer of the array substrate of FIG. 2.

Referring to FIGS. 2, 10 and 11, the passivation layer 170 is disposed so as to cover the data line 153, the source electrode 157 and the drain electrode 158 on the base substrate 110 from which the remaining photo pattern 162 is removed. The passivation layer 170 may include, for example, silicon nitride, silicon oxide, or the like or a combination thereof.

In one exemplary embodiment the passivation layer 170 on the drain electrode 158 may be etched using a third mask (not shown) to form a contact hole 172 exposing the drain electrode 158.

Referring to FIGS. 2 and 11 again, a transparent electrode layer (not shown) is disposed on the base substrate 110 on which the passivation layer 170 and the contact hole 172 are disposed.

Then, the transparent electrode layer is patterned using a fourth mask (not shown) to form a pixel electrode 180. The pixel electrode 180 makes electrical contact with the drain electrode 158 through the contact hole 172, and thus the switching element SW is electrically connected to the pixel electrode 180. The pixel electrode 180 may include a transparent conductive material. The pixel electrode 180 may include, for example, indium zinc oxide ("IZO"), indium tin oxide ("ITO"), or the like or a combination thereof.

Figure 12:
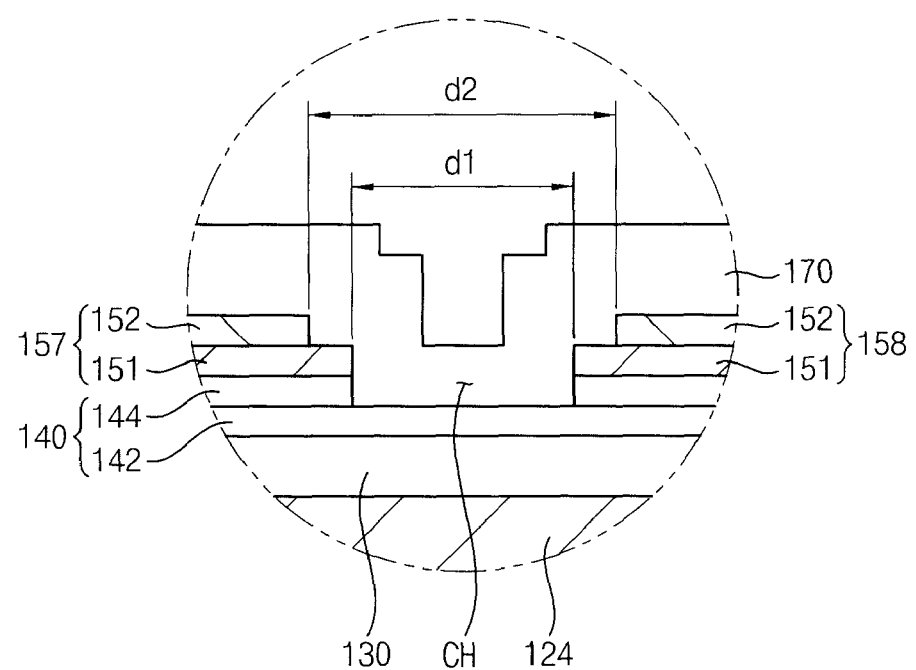
FIG. 12 is an enlarged cross-sectional view illustrating a channel portion of FIG. 2.

FIG. 12 is an enlarged cross-sectional view illustrating an exemplary embodiment of the channel portion of FIG. 2. FIG. 13 is an enlarged cross-sectional view illustrating a portion A of FIG. 2.

Referring to FIGS. 2 and 12, a first separation distance d1, which is defined between a portion of a second TFT pattern 151 corresponding to the source electrode 157 adjacent to the channel portion CH and a portion of the second TFT pattern 151 corresponding to the drain electrode 158, is smaller than a second separation distance d2, which is defined between a portion of a first TFT pattern 152 corresponding to the source electrode 157 and a portion of the first TFT pattern 152 corresponding to the drain electrode 158.

The channel pattern 140 includes the ohmic contact pattern 144, corresponding to the second TFT pattern 151, and the semiconductor pattern 142, corresponding to the ohmic contact pattern 144 and the channel portion CH.

In one exemplary embodiment the semiconductor pattern 142 is disposed on the gate insulation layer 130. The gate insulation layer 130 has a stepped portion, and the semiconductor pattern 142 is disposed on an upper portion of the gate insulation layer 130.

Except for the channel portion CH, the ohmic contact pattern 144 is disposed on the semiconductor pattern 142. In one exemplary embodiment, an end portion of the ohmic contact pattern 144 is aligned with an end portion of the semiconductor pattern 142. Accordingly, the channel pattern 140 may include the semiconductor pattern 142 corresponding to the channel portion CH.

In such an exemplary embodiment, the end portion of the second TFT pattern 151 disposed on the ohmic contact pattern 144 is aligned with the end portion of the ohmic contact pattern 144. The end portion of the first TFT pattern 152, which is disposed on the second TFT pattern 151, and the second TFT pattern 151 may form a stepped portion with respect to each other.

In a four-part process according to the present exemplary embodiment, the second and first TFT patterns 151 and 152 are formed by respectively etching the first and second metal layers 151a and 152a. Accordingly, the separation distances d1 and d2 are different from each other.

Although only the first and second TFT patterns 152 and 151 are illustrated in FIG. 12, the first line pattern 154 and the data line pattern 155 in FIG. 9 may have a stepped portion with respect to each other.

Referring to FIGS. 2, 12 and 13, the etched portions of the gate insulation layer 130 in the portion A form a stepped portion. The channel pattern 140 having a stepped portion with the gate insulation layer 130 is disposed on the gate insulation layer 130. The second TFT pattern 151 is disposed on the channel pattern 140, and the end portion of the second TFT pattern is disposed in alignment with the end portion of the channel pattern 140. The first TFT pattern 152 is disposed on the second TFT pattern 151, and the first TFT pattern 152 has a stepped portion with respect to the second TFT pattern 151.

In one exemplary embodiment the separation distance of the portions of the second TFT pattern 151 corresponding to the source and drain electrodes 157 and 158 may be between about 2 micrometers (μm) to about 10 μm, specifically about 2 μm to about 5 μm, more specifically about 3 μm.

Figure 14:
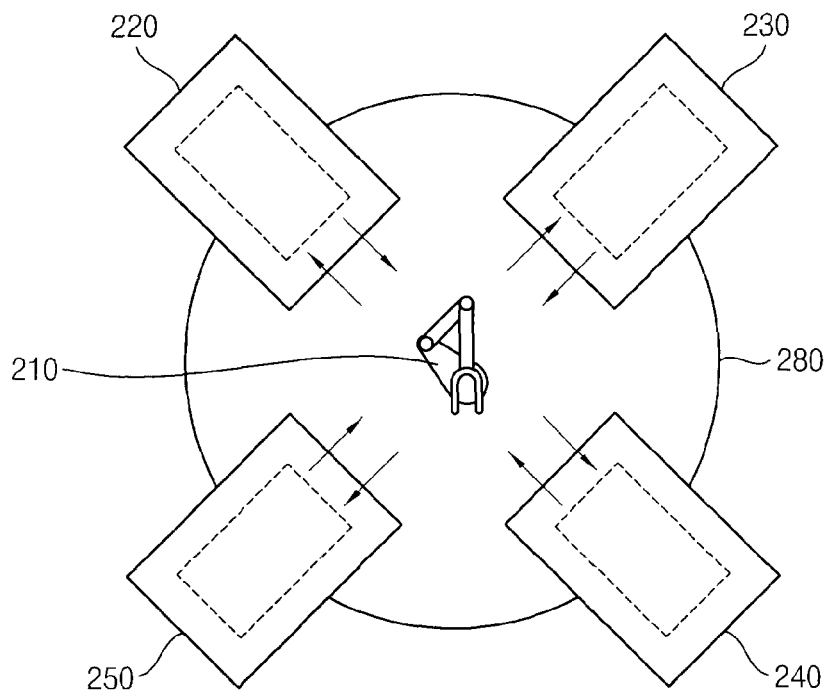
FIG. 14 is a top plan view illustrating an exemplary embodiment of an apparatus for manufacturing the array substrate of FIG. 2.
Figure 15:
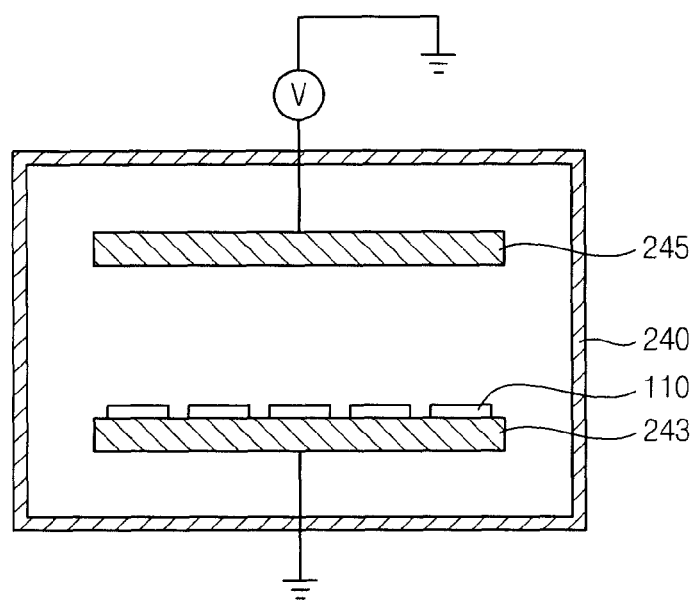
FIG. 15 is a cross-sectional view illustrating an exemplary embodiment of a dry etching chamber of FIG. 14.

FIG. 14. is a schematic plan view illustrating an exemplary embodiment of the apparatus for manufacturing the array substrate of FIG. 2. FIG. 15 is a schematic cross-sectional view illustrating an exemplary embodiment of the dry etching chamber of FIG. 14.

Referring FIGS. 2, 3 to 11 and 14, an apparatus 200 for manufacturing the array substrate includes a transfer robot 210, a deposition chamber 220, a wet etching chamber 230, a dry etching chamber 240, a protection chamber 250 and a rotation unit 280.

The rotation unit 280 rotates a plurality of chambers 220 to 250 to perform a manufacturing process.

A deposition method in the deposition chamber 220 may include, for example, a chemical vapor deposition ("CVD") method, a sputtering process or the like. The CVD method may include a plasma enhanced chemical vapor deposition ("PECVD") process.

In the deposition chamber 220 the gate metal layer (not shown), the gate insulation layer 130, the channel layer 140a, the metal layer for the data line 150a, the passivation layer 170 and the transparent electrode layer (not shown) may be disposed by PECVD or the like.

Although not shown in FIG. 14, the apparatus 200 for manufacturing the array substrate may further include an exposing apparatus, which disposes a photoresist layer and exposes the photoresist layer using the first to fourth masks. The exposing process may be performed before the base substrate 110 moves from the deposition chamber 220 to the wet etching chamber 230 and/or the dry etching chamber 240.

The protection chamber 250 may be, for example, a cleaning chamber, in which the base substrate 110 is cleaned, a heating chamber, in which the base substrate 110 is heated or a cooling chamber, in which the base substrate 110 is cooled.

In one exemplary embodiment the base substrate 110 manufactured in the previous manufacturing process may be disposed in the deposition chamber 220 from the exterior by the transfer robot 210, and the gate metal layer may be disposed in the deposition chamber 220.

The base substrate 110 on which the gate metal layer is disposed may be moved to the wet etching chamber 230 by the transfer robot 210, and the gate pattern 120 may be disposed by wet etching.

The base substrate 110, on which the gate pattern 120 is disposed, may be moved to the deposition chamber 220 by the transfer robot 210, and in the deposition chamber 220, the gate insulation layer 130, the channel layer 140a and the metal layer for the data line may be sequentially disposed on the base substrate on which the gate pattern 120 is disposed.

Then, in the wet etching chamber 230, the first and second metal layers 151a and 152a of the base substrate 110, on which the gate insulation layer 130, the channel pattern 140 and the metal layer for the data line 150a are disposed, are entirely etched, to form the first element pattern 151b. Then, in the wet etching chamber 230, the second metal layer 152a of the base substrate 110, on which the gate insulation layer 130, the channel pattern 140 and the metal layer for the data line 150a are disposed, is etched to form the second electrode pattern 150c and the data line 153.

Then, the first element pattern 151b and the sub-channel pattern 140b are etched in the dry etching chamber 240. In an exemplary embodiment, the gate insulation layer 130 may also be etched.

In an exemplary embodiment, in the dry etching chamber 240 an oxide layer of the first element pattern 151b may be removed by contacting the first element pattern 151b with the reactive gas, which may include carbon tetrafluoride ($CF_4$), sulfur hexafluoride ($SF_6$), a mixture of sulfur hexafluoride and helium ($SF_6$/He), a mixture of sulfur hexafluoride and nitrogen ($SF_6$/$N_2$), a mixture of sulfur hexafluoride and oxygen ($SF_6$/$O_2$), a mixture of sulfur hexafluoride, oxygen and helium ($SF_6$/$O_2$/He), or the like or a combination thereof.

Additionally, in the dry etching chamber 240, the first element pattern 151b and the sub-channel pattern 140b may be etched by contacting with the etching gas, which may include a mixture of sulfur hexafluoride and chlorine ($SF_6$, $Cl_2$).

In the protection chamber 250, a cleaning process is performed to remove chloride ions, which result from the etching gas, from the base substrate 110 on which the channel portion CH is disposed.

Then, in the deposition chamber 220, the passivation layer 170 is disposed to cover the data line 153 and the source and drain electrodes 157 and 158 on the base substrate 110, and the passivation layer 170 is etched in the dry etching chamber 240 to form the contact hole 172.

Then, in the deposition chamber 220, a transparent electrode layer is disposed to cover the passivation layer 170, and the transparent electrode layer is etched to form the pixel electrode 180 in the wet and/or dry etching chambers 230 and 240.

Referring to FIGS. 14 and 15, the dry etching chamber 240 includes a first substrate 243 and a second substrate 245.

The base substrate 110 corresponding to each step is disposed on the first substrate 243.

The dry etching chamber 240 receives the reactive gas and the etching gas from outside and forms plasma between the second substrate 245, which is connected to a voltage supply V, and the first substrate 243, which is grounded.

Accordingly, in the dry etching chamber 240, a process for removing an oxide layer of the first element pattern 151b and a process for dry etching the first element pattern 151b and the sub-channel pattern 140b may be performed using the plasma.

While not wanting to be bound by theory, it is understood that the oxide layer on the first element pattern 151b chemically reacts with the reactive gas, and the first element pattern 151b and the sub-channel pattern 140b chemically react with the etching gas. Accordingly, the voltage supply V provides a low voltage of about 40 V to about 60 V, specifically about 45 V to about 55 V, more specifically about 50 V to perform the manufacturing process for the array substrate 100.

In an embodiment, since the oxide layer of the first element pattern 151b (e.g., the TFT pattern) may be converted to the fluoride layer using the reactive gas, which includes the fluoride containing compound, the first element pattern 151b may be etched without interference from an oxide and the reliability of manufacturing process may be improved.

Additionally, the portion of the first element pattern 151b and the sub-channel pattern 140b, which are disposed on an area which is wider than an area of the remaining photo pattern 162, are dry-etched at the same time, so that the width of the channel pattern 140 of the switching element SW may be reduced, and the separation distance of the source and drain electrodes 157 and 158 of the switching element SW may be reduced. Thus, electrical characteristics of the switching element SW may be improved.

Figure 16:
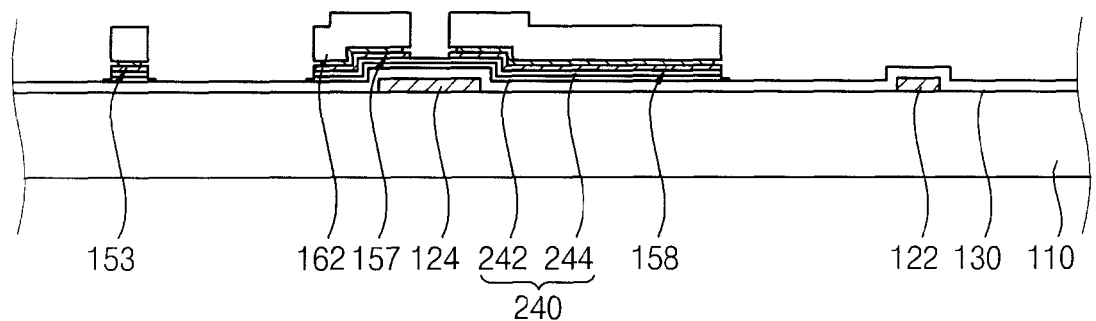
FIG. 16 is a cross-sectional view illustrating another exemplary embodiment of a method of manufacturing a source pattern of the array substrate.
Figure 17:
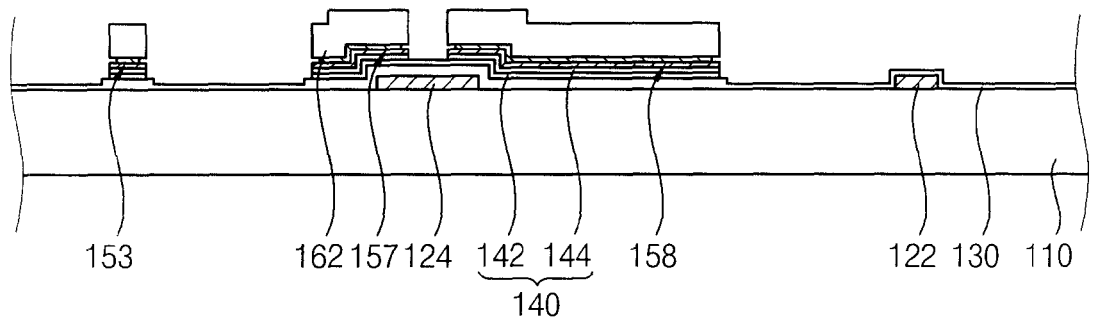
FIG. 17 is a cross-sectional view illustrating an exemplary embodiment of a method of manufacturing a channel portion of the array substrate of FIG. 16.

FIG. 16 is a cross-sectional view illustrating another exemplary embodiment of a method of manufacturing a source pattern of an array substrate. FIG. 17 is a cross-sectional view illustrating an exemplary embodiment of a method of manufacturing a channel portion of the array substrate of FIG. 16.

A method for manufacturing an array substrate according to the present exemplary embodiment is substantially the same as the method according to the previous exemplary embodiment except that the first element pattern 151b and the sub-channel pattern 140b of FIG. 9 are first etched by a metal etching gas as illustrated in FIG. 16, and the sub-channel pattern 140b is etched by a channel etching gas as illustrated in FIG. 17. Accordingly, the same reference numerals will be used to refer to the same or like elements as those described in the previous exemplary embodiment and any further repetitive explanation concerning the above elements will be omitted.

Referring to FIGS. 2, 9 and 16, the exposed second electrode pattern 150c is dry-etched using the remaining photo pattern 162 as an etch stop layer to form the source and drain electrodes 157 and 158 of the switching element SW.

The source electrode 157 is electrically connected to the data line 153, and the drain electrode 158 is spaced apart from the source electrode 157. A separation distance of the source and drain electrodes 157 and 158 of the switching element SW decreases via dry etching. Accordingly, electrical characteristics of the switching element SW may be improved.

In an embodiment, an oxide layer disposed on a surface of the first element pattern 151b may be converted to the fluoride layer. Since the fluoride layer may be easily vaporized, the first element pattern 151b may be etched without interference from the oxide layer.

When the first element pattern 151b is etched by the metal etching liquid, the portion of the sub-channel pattern 140b on an area larger than the remaining photo pattern 162 is partially etched, and thus a dummy channel pattern 240 may be formed.

The dummy channel pattern 240 may include a dummy ohmic pattern 244 and a dummy semiconductor pattern 242. The sub-ohmic pattern, except in an area corresponding to a separation region between the source and drain electrodes 157 and 158, is removed in an area which is larger than an area corresponding to the remaining photo pattern 162, thereby forming the dummy ohmic pattern 244. In addition, the sub-semiconductor pattern, except in the area corresponding to the separation region between the source and drain electrodes 157 and 158, is removed in the area corresponding to the sub-semiconductor pattern 142b, thereby forming the dummy ohmic pattern 244.

Since a reaction rate of the sub-channel pattern 140b with the metal etching liquid is faster than the reaction rate of the first element pattern 151b with the metal etching liquid, the thickness of the sub-channel pattern 140b etched by the metal etching liquid may be greater than the thickness of the first element pattern 151b etched by the metal etching liquid. In addition, since the gate insulation layer 130 is exposed in an area of the base substrate 110, except in an area in which the sub-channel pattern 140b is disposed, the exposed portion of the gate insulation layer 130 may also be etched with the first element pattern 151b and the sub-channel pattern 140b. In such an exemplary embodiment, the reaction rate of the gate insulation layer 130 with the metal etching gas may be faster than the reaction rate of the first element pattern 151b with the metal etching gas. Accordingly, the thickness of the gate insulation layer 130 etched by the metal etching gas may be greater than the thickness of the first element pattern 151b etched by the metal etching gas.

The first element pattern 151b (e.g., the TFT pattern) exposed by the remaining photo pattern 162 may be dry-etched using the metal etching gas. The metal etching gas may be a chlorine-based gas and may include chlorine. For example, in one exemplary embodiment an etching component of the metal etching gas may be chloride ions ($Cl^-$) In an embodiment, the metal etching gas may be a gas mixture including chlorine ($Cl_2$), boron trichloride ($BCl_3$), or the like or a combination thereof. For example, the metal etching gas may include a mixture of chlorine and helium ($Cl_2/He$), a mixture of chlorine and argon ($Cl_2/Ar$), chlorine ($Cl_2$), or the like or a combination thereof.

For example, in the exemplary embodiment wherein a mixture of chlorine and helium ($Cl_2/He$) is used as the metal etching gas, the internal pressure of the dry etching chamber when the metal etching gas is provided to the dry etching chamber may be about 60 mT to about 200 mT, specifically about 80 mT to about 180 mT, more specifically about 100 mT to about 160 mT. In an exemplary embodiment, a mole ratio of chlorine ($Cl_2$) and helium (He) may be about 1:0 to about 1:5, specifically about 1:1 to about 1:4, more specifically about 1:2 to about 1:3.

By disposing the source and drain electrodes 157 and 158, the dummy ohmic pattern 244 may be exposed through a separation region between the source and drain electrodes 157 and 158. The first element pattern 151b may remain in the separation region between the source and drain electrodes 157 and 158.

Referring to FIGS. 2, 16 and 17, the dummy ohmic pattern 244, exposed using the remaining photo pattern 162 and the source and drain electrodes 157 and 158 as the etch stop layer, is removed with the first element pattern 151b, and thus the channel pattern 140 may be formed. In such an exemplary embodiment, the dummy ohmic pattern 244 may be dry-etched using the channel etching gas.

For example, the portion of the dummy ohmic pattern 244 exposed through the separation region between the source and drain electrodes 157 and 158 may be removed, and the portion of the dummy semiconductor pattern 242, exposed because it extends beyond an area of the remaining photo pattern 162, may be removed, and the remaining portion of the first element pattern 151b may be removed.

In such an exemplary embodiment, the portion of the dummy ohmic pattern 244 and the dummy semiconductor pattern 242 disposed beyond an area of the remaining photo pattern 162 are dry-etched at the same time. Thus the width of the channel pattern 140 may be narrower than the width of the sub-channel pattern 140b, because the portion of the dummy semiconductor pattern 242 exposed because it extends beyond the area of the remaining photo pattern 162 may be entirely removed. Accordingly, electrical characteristics of the switching element SW may be improved.

The portion of the gate insulation layer 130 exposed on the area of the base substrate 110, except an area on which the sub-channel pattern 140b is disposed, may be additionally etched by the channel etching gas. Accordingly, the etched portions of the gate insulation layer 130 may form a stepped portion.

In an exemplary embodiment, the remaining photo pattern 162 is partially removed and the thickness of the remaining photo pattern 162 may be less than the third thickness THc. Accordingly, the semiconductor pattern 142 of the channel pattern 140 is exposed, and the channel portion CH is formed.

An apparatus for manufacturing the array substrate according to the present exemplary embodiment is substantially the same as that the apparatus according to the previous exemplary embodiment except for the type of gas used in the dry etching chamber. Accordingly, the same reference numerals will be used to refer to the same or like parts as those described in the previous exemplary embodiment, and any further repetitive explanation concerning the above elements will be omitted.

In the dry etching chamber 240, when the first element pattern 151b and the sub-channel pattern 140b of the base substrate 110, on which the channel layer 140a and the metal layer for the data line 150a are disposed, are etched, the metal etching gas and the dry etching gas may be used.

In the process of manufacturing the array substrate according to an exemplary embodiment, the first element pattern 151b may be etched independently from the sub-channel pattern 140b in regions corresponding to the separation region between the source and drain electrodes 157 and 158. Accordingly, the first element pattern 151b and the sub-channel pattern 140b may be more precisely etched, and the reliability of manufacturing process may be improved.

According to an exemplary embodiment, an oxide layer of a first element pattern may be converted with a reactive gas to a fluoride layer, which may be easily vaporized. The reactive gas may include a fluoride containing compound. Accordingly, the first element pattern may be etched without interference from an oxide, and the reliability of manufacturing process may be improved.

Additionally, by dry etching the first element pattern and a sub-channel pattern, which are wider than an area of a remaining photo pattern, at the same time, the width of a channel pattern of a switching element may be decreased. Because the separation distance of source and drain electrodes of the switching element is decreased, electrical characteristics of the switching element may be improved.

Additionally, by etching the first element pattern and the sub-channel pattern independently, since the first element pattern and the sub-channel pattern may be more precisely etched, the reliability of manufacturing process may be improved.

The foregoing is illustrative and is not to be construed as limiting thereof. Although a few exemplary embodiments have been described, those skilled in the art will readily appreciate that many modifications are possible without materially departing from the novel teachings and advantages, features and aspects of the foregoing exemplary embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific exemplary embodiments disclosed, and that modifications to the disclosed exemplary embodiments, as well as other exemplary embodiments, are intended to be included within the scope of the appended claims. The present invention is defined by the following claims, with equivalents of the claims to be included therein.

What is claimed is:

1. A method for manufacturing an array substrate, the method comprising:
   sequentially disposing a first metal layer and a second metal layer on a base substrate on which a gate line, a gate electrode and a channel layer are disposed;
   sequentially etching the second metal layer and the first metal layer to form a metal line pattern, the metal line pattern including a first line pattern, a second line pattern and a first electrode pattern, the first electrode pattern including a first element pattern and a second element pattern;
   partially etching the second element pattern to form a second electrode pattern, the second electrode pattern comprising the first element pattern and a partially etched second element pattern;
   partially etching the second line pattern to form a data line, the data line comprising the first line pattern and a partially etched second line pattern;
   converting an oxide layer to a fluoride layer by contacting the oxide layer with a reactive gas, the reactive gas comprising a fluoride containing compound, the oxide layer being naturally formed on the first element pattern when forming the second electrode pattern;
   etching the fluoride layer and an exposed portion of the first element pattern to form a source electrode electrically connected to the data line and a drain electrode spaced apart from the source electrode; and
   disposing a pixel electrode to electrically contact the drain electrode.

2. The method of claim 1, wherein the first metal layer includes titanium, and the second metal layer includes copper.

3. The method of claim 1, wherein a width of the first element pattern is greater than a width of the partially etched second element pattern.

4. The method of claim 3, wherein a distance between the source and drain electrodes of the etched first element pattern is about 2 micrometers to about 3 micrometers.

5. The method of claim 1, wherein the reactive gas includes at least one gas selected from a group consisting of carbon tetrafluoride, sulfur hexafluoride, a mixture of sulfur hexafluoride and helium, a mixture of sulfur hexafluoride and nitrogen, a mixture of sulfur hexafluoride and oxygen and a mixture of sulfur hexafluoride, oxygen and helium.

6. The method of claim 1, wherein the first electrode pattern, the second electrode pattern and the data line are formed via wet etching, and the source and drain electrodes are formed via dry etching.

7. The method of claim 1, further comprising:
disposing a gate insulation layer on the base substrate on which the gate line and the gate electrode are disposed; and
disposing a photoresist layer on the second metal layer.

8. The method of claim 7, wherein forming the first electrode pattern further comprises:
forming an exposed area through the photoresist layer using a mask to form a source photo pattern; and
etching the first element pattern and the second element pattern in a region exposed by the source photo pattern to form the first electrode pattern having a width, which is less than a width of the source photo pattern.

9. The method of claim 8, further comprising:
etching the channel layer to form a sub-channel pattern having a width which is substantially the same as a width of the source photo pattern; and
removing the source photo pattern to form a remaining photo pattern, wherein an end portion of the remaining photo pattern is aligned with an end portion of the first electrode pattern, and the remaining photo pattern has a separate portion corresponding to a separation region between the source and drain electrodes.

10. The method of claim 9, wherein forming the source electrode and the drain electrode further comprises:
etching the first element pattern using the remaining photo pattern as a mask to form the source and drain electrodes, wherein a separation distance between portions of the first element pattern after the etching is less than a separation distance between portions of the etched second element pattern after the etching;
etching the sub-channel pattern using the remaining photo pattern as a mask to form a channel pattern including a channel portion; and
etching the gate insulation layer in a region exposed by the remaining photo pattern and the sub-channel pattern to form an etched gate insulation layer.

11. The method of claim 10, wherein etched portions of the etched gate insulation layer have a stepped portion with respect to each other.

12. The method of claim 10, wherein the source and drain electrodes and the channel pattern are formed at the same time, an etching gas includes chlorine and fluorine, and an etching component comprises chloride ions.

13. The method of claim 10, wherein a reaction rate of the sub-channel pattern and an etching gas and a reaction rate of the gate insulation layer and the etching gas are greater than a reaction rate of the first element pattern and the etching gas.

14. The method of claim 10, wherein an etching gas includes metal and channel etching gases, the metal etching gas etching the first element pattern and including chlorine, the channel etching gas etching the sub-channel pattern and including chlorine and fluorine, and an etching component of the etching gas comprises chloride ions.

15. The method of claim 14, wherein the chloride ions of the metal etching gas etch the sub-channel pattern, and a reaction rate of the sub-channel pattern and the metal etching gas is greater than a reaction rate of the first element pattern and the metal etching gas.

16. The method of claim 14, wherein a reaction rate of the gate insulation layer and the etching gas is greater than a reaction rate of the first element pattern and the etching gas.

* * * * *